United States Patent
Pakkala et al.

[11] Patent Number: 6,154,081
[45] Date of Patent: Nov. 28, 2000

[54] LOAD CIRCUIT HAVING EXTENDED REVERSE VOLTAGE PROTECTION

[75] Inventors: William Frank Pakkala, Owosso; Steven C. Kekel, Grand Blanc; Paul Louis Du Bois, Flint; Daniel Alexander Crawford, Burton, all of Mich.; Adam L. Burnham, Eagan, Minn.

[73] Assignee: Delphi Technologies, Inc., Troy, Mich.

[21] Appl. No.: 09/333,461

[22] Filed: Jun. 15, 1999

[51] Int. Cl.[7] ................................................ H03K 5/08
[52] U.S. Cl. ........................... 327/309; 361/59; 361/91.1
[58] Field of Search .................................... 327/309, 545, 327/546; 361/54, 56, 91.1, 91.5

[56] References Cited

U.S. PATENT DOCUMENTS 4,763,235  8/1988  Morita ........................................ 361/19
5,339,210  8/1994  Howell ......................................... 361/9

Primary Examiner—Timothy P. Callahan
Assistant Examiner—An T. Luu
Attorney, Agent, or Firm—Vincent A. Cichosz

[57] ABSTRACT

An improved reverse voltage protection circuit that protects sensitive electronic devices from damage due to both reversed battery connections and source voltage interruptions. An N-channel protection FET is inversely connected between the negative terminal of the protected device and ground, and the conduction of the protection FET is extended during a reverse transient protection period following interruption of the source voltage. A capacitor connected across the gate-to-source circuit of the protection FET is charged from the source voltage through a low impedance charging circuit including a diode to prevent the capacitor from discharging, and is discharged during an interruption of the source voltage through a high impedance discharging circuit connected in parallel with the charging circuit.

8 Claims, 1 Drawing Sheet

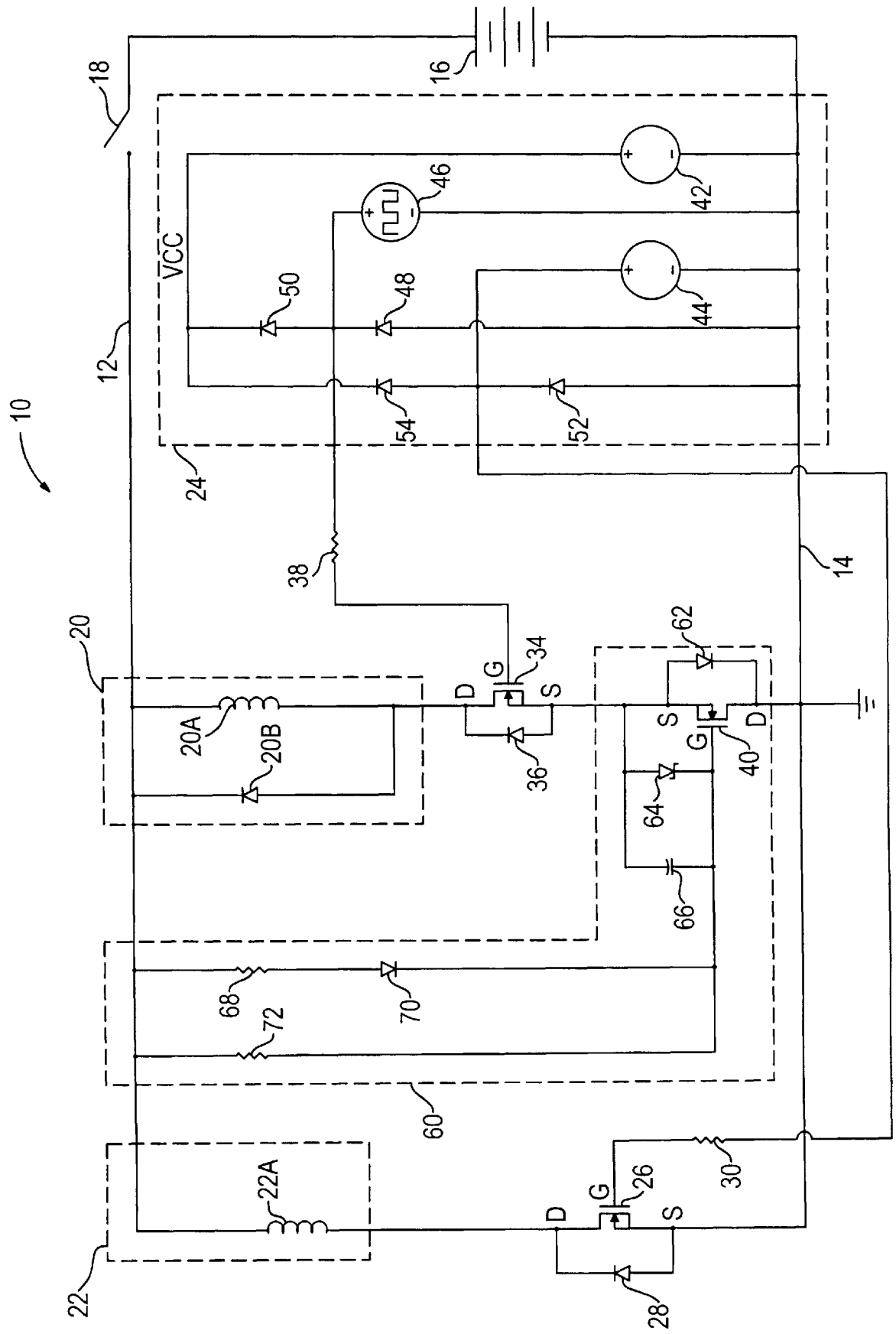

LOAD CIRCUIT HAVING EXTENDED REVERSE VOLTAGE PROTECTION

TECHNICAL FIELD

This invention relates to circuitry for protecting load circuit electronic devices from damage due to a source voltage polarity reversal, including transient voltages due to an interruption of the source voltage.

BACKGROUND OF THE INVENTION

A common design requirement in automotive electronic applications is the provision of circuitry to protect electronic devices from damage due to reverse voltages. Most commonly, reverse voltages occur when the source (battery) cables are mistakenly reversed, or when improperly attempting to jump-start a disabled vehicle. A more intense, but limited duration situation occurs when the source voltage is suddenly interrupted, as may occur due to a loose or severed cable or connector; in such a case, interrupted reactive loads can produce relatively high reverse voltage transients that quickly damage electronic switching devices such as power transistors.

The need exists, therefore, to provide protection from reverse voltage damage, whether due to reversed battery connections, or source voltage interruptions.

SUMMARY OF THE INVENTION

The present invention is directed to an improved reverse voltage protection circuit that protects load circuit electronic devices from damage due to both reversed battery connections and source voltage interruptions.

According to the invention, a reverse voltage sensitive device is protected by a protection transistor connected between the negative terminal of the load circuit and ground, and the conduction of the protection transistor is extended during a reverse transient protection period following interruption of the source voltage. A capacitor connected to a control terminal of the protection transistor is charged from the source voltage through a low impedance charging circuit including a diode to prevent the capacitor from discharging, and is discharged during an interruption of the source voltage through a high impedance discharging circuit connected in parallel with the charging circuit.

If the battery connections are reversed with the capacitor discharged, the protection transistor will be non-conductive and an intrinsic diode across the current carrying terminals of the protection transistor will block current flow through the load circuit. When the battery connection is correctly established, the capacitor quickly charges through the low impedance charging path to bias the protection transistor conductive. The impedance of the discharge path is selected so that if the battery connection is subsequently interrupted, the capacitor will maintain the protection transistor in a conductive state to maintain the ground reference of the load circuit for a reverse protection interval which exceeds the expected duration of the resulting reverse voltage transient, thereby preventing damage to the load circuit electronic devices.

BRIEF DESCRIPTION OF THE DRAWINGS

The single drawing FIGURE depicts the extended reverse battery protection circuit of this invention, as applied to an automotive cruise control circuit.

DESCRIPTION OF THE PREFERRED EMBODIMENT

Referring to drawing, the reference numeral 10 generally designates an automotive cruise control circuit including a source voltage line 12 and a ground line 14. The ground line 14 is electrically coupled to the negative terminal of a storage battery 16, and the source voltage line 12 is coupled to the positive terminal of battery 16 via an ignition key operated switch 18. The cruise control circuit 10 includes an electric motor 20, an electromagnetic clutch 22 for selectively coupling the motor 20 to an engine throttle cable (not shown), and a micro-controller 24 for controlling the operation of the motor 20 and clutch 22. The clutch 22 is electrically represented by the winding 22A, and the motor 20 is represented by the winding 20A and the anti-parallel, or free-wheeling, diode 20B. The clutch winding 22A is coupled to ground line 14 via the drain (D) and source (S) terminals of N-channel FET 26, which includes an intrinsic or body diode 28, and the gate (G) of FET 26 is connected to the micro-controller 24 via resistor 30. The motor winding 20A is coupled to the drain (D) of N-channel FET 34, which includes an intrinsic or body diode 36, and the gate (G) of FET 34 is connected to the micro-controller 24 via resistor 38. The source (S) of FET 34 is coupled to ground line 14 via the source (S) and drain (D) terminals of reverse voltage protection N-channel FET 40. Of course, motor 20 may include one or more additional windings, as in the case of a stepper motor or a multi-phase brushless DC motor; in such case, the additional winding(s) and its control FET will be coupled between source voltage line 12 and the source (S) of reverse voltage protection FET 40—that is, in parallel with the series combination of winding 20A and FET 34.

During cruise control operation, the micro-controller 24 controls the FETs 26 and 34 to continuously energize the clutch winding 22A, and to pulse width modulate the motor winding 20A to produce a desired movement of the throttle cable (not shown). The micro-controller 24 is depicted as a voltage source model, including a DC source 42 for establishing a regulated internal voltage reference VCC, a DC source 44 coupled to the resistor 30 for biasing FET 26 to a conductive state, and a square-wave voltage source 46 connected to the resistor 38 for biasing the FET 34 on and off, assuming that reverse voltage protection FET 40 is conductive. The source 44 is referenced to ground and VCC by the intrinsic diodes 48 and 50, respectively, and the source 46 is referenced to ground and VCC by intrinsic diodes 52 and 54, respectively.

The reverse voltage protection FET 40 is the primary component of the extended reverse voltage protection circuit of this invention, designated by the reference numeral 60. The FET 40 is connected in an inverse orientation, relative to the FET 34, and includes an intrinsic or body diode 62 as shown. A zener diode 64 is connected across the gate-to-source circuit of the FET 40, and a capacitor 66 is connected in parallel with the diode 64. The gate (G) of FET 40 is connected to the source voltage line 12 via the series combination of resistor 68 and diode 70, which form a charging circuit for the capacitor 66, and also via resistor 72, which forms a reverse transient discharge circuit for capacitor 66.

The FET 40 provides reverse battery protection for FET 34 by electrically isolating the source of FET 34 from ground line 14 when the positive and negative terminals of battery 16 are reversed, relative to the cruise control circuit 10. In that situation, the FET 40 is biased non-conductive since its gate and source terminals are at substantially the same potential, and the intrinsic diode 62 is reverse biased to block current which would otherwise flow in a low impedance path through diodes 36 and 20B.

When the terminals of battery 16 are correctly connected to the cruise control circuit 10, the capacitor 66 quickly charges through the series combination of resistor 68 and diode 70. This raises the gate (G) of FET 40 to a higher potential than its source (S), biasing FET 40 to a conductive state, and electrically coupling ground line 14 to the source (S) of FET 34. The zener diode 64 has a breakdown voltage of less than the rated gate-to-source voltage, so that it conducts to protect FET 40 in the event of excessive gate-to-source voltage.

If the positive terminal of battery 16 is suddenly disconnected from the cruise control circuit 10 (as represented by opening ignition switch 18, for example), the supply of current to clutch coil 22A is suddenly interrupted. When this happens, a large negative transient voltage appears on voltage source line 12. The negative transient forward biases the intrinsic diode 36 of FET 34, and if FET 40 were non-conductive, a large negative transient voltage would appear at the source (S) terminal of FET 34. Such a transient could easily damage the FET 34 since its gate (G) terminal remains substantially at ground potential due to the action of intrinsic diode 48. That is, the resulting gate-to-source voltage Vgs could easily exceed the FET rating, possibly permanently damaging the FET 34. However, the charged capacitor 66 of protection circuit 60 maintains the FET 40 in a conductive state for a predetermined interval after the source voltage interruption. During such interval, the source (S) terminal of FET 34 remains referenced to ground line 14, eliminating the possibility of a destructive gate-to-source voltage. The duration of the interval is determined by the magnitude of the negative transient, and the time constant of capacitor 66 and resistor 72 through which capacitor 66 discharges during the transient. In a mechanization of the present invention, the resistor and capacitor values were as follows: capacitor 66=0.1 uF, resistor 68=10 kohm, and resistor 72=100 kohm. This provides a charging time constant of 1 msec, and a discharge time constant of 10 msec. Of course, other values could be used to achieve a similar result, and the time constants may vary from application to application.

In summary, the extended reverse voltage protection circuit of the present invention provides protection from reverse voltage damage, whether due to reversed battery connections, or source voltage interruptions. Although described in reference to the illustrated embodiment, it will be appreciated that various modifications will occur to those skilled in the art. For example, the invention is not limited to use with cruise control circuits, or even automotive circuits in general. Accordingly, protection circuits incorporating these and other modifications may fall within the scope of this invention, which is defined by the appended claims.

What is claimed is:

1. A protected load circuit powered by a power source having first and second polarity terminals, comprising:
   first and second load circuit terminals normally connected to the first and second terminals of said power source, respectively;
   a load circuit including an electrical load, a load switching device, and a protection transistor connected in series, the electrical load being electrically coupled to the first load circuit terminal, and the protection transistor being electrically coupled to the second load circuit terminal, the protection transistor being effective in a conductive state to electrically couple said load switching device to the second load circuit terminal, and in a non-conductive state to electrically isolate the load switching device from the second load circuit terminal;
   a capacitor coupled to a control terminal of said protection transistor, said capacitor being effective when charged to bias said protection transistor to said conductive state, and when discharged to bias said protection transistor to said non-conductive state;
   a charging circuit for charging said capacitor to bias said protection transistor to said conductive state when the first and second load circuit terminals are connected to the first and second polarity terminal of said power source, respectively, but for allowing said capacitor to bias said protection transistor to said non-conductive state when the first and second polarity terminals of said power source are reversed; and
   a discharging circuit for discharging said capacitor during a discharge interval when the voltage across said load circuit is momentarily reversed due to a disconnection of said power source, thereby allowing said protection transistor to remain in said conductive state during said discharge interval for protecting said load switching device from damage due to the momentary voltage reversal.

2. The protected load circuit of claim 1, wherein said protection transistor is a FET having a source terminal connected to said load switching device and said capacitor is connected between said control terminal and said source terminal.

3. The protected load circuit of claim 2, wherein said charging circuit comprises a first resistor and diode connected in series between said first load circuit terminal and said control terminal.

4. The protected load circuit of claim 3, wherein said discharging circuit comprises a second resistor connected in parallel with said charging circuit.

5. The protected load circuit of claim 2, wherein said discharging circuit includes a resistor connected between said first load circuit terminal and said control terminal.

6. The protected load circuit of claim 1, wherein said discharge interval is at least as long in duration as an expected duration of said momentary voltage reversal.

7. The protected load circuit of claim 1, wherein:
   said protection transistor is a FET having a source terminal connected to said load switching device and said capacitor is connected between said control terminal and said source terminal;
   said charging circuit comprises a first resistor and diode connected in series between said first load circuit terminal and said control terminal;
   said discharging circuit comprises a second resistor connected in parallel with said charging circuit; and
   said discharge interval is at least as long in duration as an expected duration of said momentary voltage reversal.

8. The protected load circuit of claim 7, wherein said load switching device is a FET having a source terminal connected to said protection transistor and a gate terminal referenced to said second load circuit terminal, the protection transistor operating during said discharge interval to maintain said source terminal at substantially the same potential as said gate terminal, thereby protecting said FET by limiting a potential difference between said gate and source terminals during said discharge interval.

* * * * *